United States Patent
Seefeldt (10) Patent No.: US 7,965,118 B2
(45) Date of Patent: Jun. 21, 2011

(54) METHOD AND APPARATUS FOR ACHIEVING 50% DUTY CYCLE ON THE OUTPUT VCO OF A PHASED LOCKED LOOP

(75) Inventor: James Douglas Seefeldt, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/171,805

(22) Filed: Jul. 11, 2008

(65) Prior Publication Data

US 2010/0007393 A1    Jan. 14, 2010

(51) Int. Cl.
  *H03K 3/017*    (2006.01)
(52) U.S. Cl. ............ 327/175; 327/172; 327/54; 327/55; 330/257; 330/260
(58) Field of Classification Search ............ 327/172, 327/175, 52, 54, 56, 59, 60, 63, 65, 67, 55; 331/57, 185; 330/257, 260
See application file for complete search history.

(56) References Cited

U.S. PATENT DOCUMENTS

| | | | |
|---|---|---|---|
| 4,437,171 A | 3/1984 | Hudson et al. | |
| 4,496,856 A | 1/1985 | Ransom et al. | |
| 4,533,842 A | 8/1985 | Yang et al. | |
| 4,656,375 A | 4/1987 | Lauffer et al. | |
| 4,968,905 A | 11/1990 | Sanwo et al. | |
| 5,034,635 A | 7/1991 | Ten Eyck | |
| 5,166,558 A | 11/1992 | Ohsawa | |
| 5,572,158 A * | 11/1996 | Lee et al. | 327/175 |
| 6,104,229 A | 8/2000 | Lien | |
| 6,169,434 B1 * | 1/2001 | Portmann | 327/175 |
| 6,535,017 B1 | 3/2003 | Fulkerson | |
| 6,563,342 B1 | 5/2003 | Fulkerson | |
| 7,088,160 B2 * | 8/2006 | Harms et al. | 327/175 |
| 7,274,216 B2 | 7/2007 | Muise et al. | |
| 2005/0225370 A1 | 10/2005 | Harms et al. | |
| 2007/0025163 A1 * | 2/2007 | Partsch et al. | 365/189.09 |
| 2007/0132494 A1 | 6/2007 | Kim | |
| 2007/0159224 A1 * | 7/2007 | Dwarka et al. | 327/175 |
| 2009/0174432 A1 | 7/2009 | Loukusa et al. | |

OTHER PUBLICATIONS

European Search Report from corresponding EP Application No. 09164251.2-1233, mailed Oct. 8, 2009, 3 pages.
Office Action from corresponding EP Application No. 09164251.2-1233, mailed Nov. 4, 2009, 4 pages.

* cited by examiner

*Primary Examiner* — Lincoln Donovan
*Assistant Examiner* — Shikha Goyal
(74) *Attorney, Agent, or Firm* — Shumaker & Sieffert, P.A.

(57) ABSTRACT

Described herein are methods and apparatuses for achieving a desired duty cycle on an output of a PLL. According to one embodiment, a method is described, including generating a single ended clock signal from a differential common mode clock signal using a limiting differential amplifier, wherein the single ended clock signal has a duty cycle, generating a differential bias current signal in response to the duty cycle of the single ended clock signal, and correcting the duty cycle of the single ended clock signal to a desired duty cycle by applying the differential bias current signal to the limiting differential amplifier. According to another embodiment, a CML-to-CMOS converter circuit is described, including a limiting differential amplifier for generating a single ended clock signal from a differential common mode clock signal, wherein the single ended clock signal has a duty cycle, a low-pass filter for generating a measurement of the duty cycle of the single ended clock signal, and a second differential amplifier for (i) comparing the measurement with a reference voltage and (ii) generating a differential bias current signal in response to the comparison.

20 Claims, 4 Drawing Sheets

METHOD AND APPARATUS FOR ACHIEVING 50% DUTY CYCLE ON THE OUTPUT VCO OF A PHASED LOCKED LOOP

FIELD OF THE INVENTION

The invention described herein is related to a phase-locked loop (PLL), and more particularly, to a method and apparatus for achieving a desired duty cycle on the output VCO of a PLL.

BACKGROUND

Figure 1:
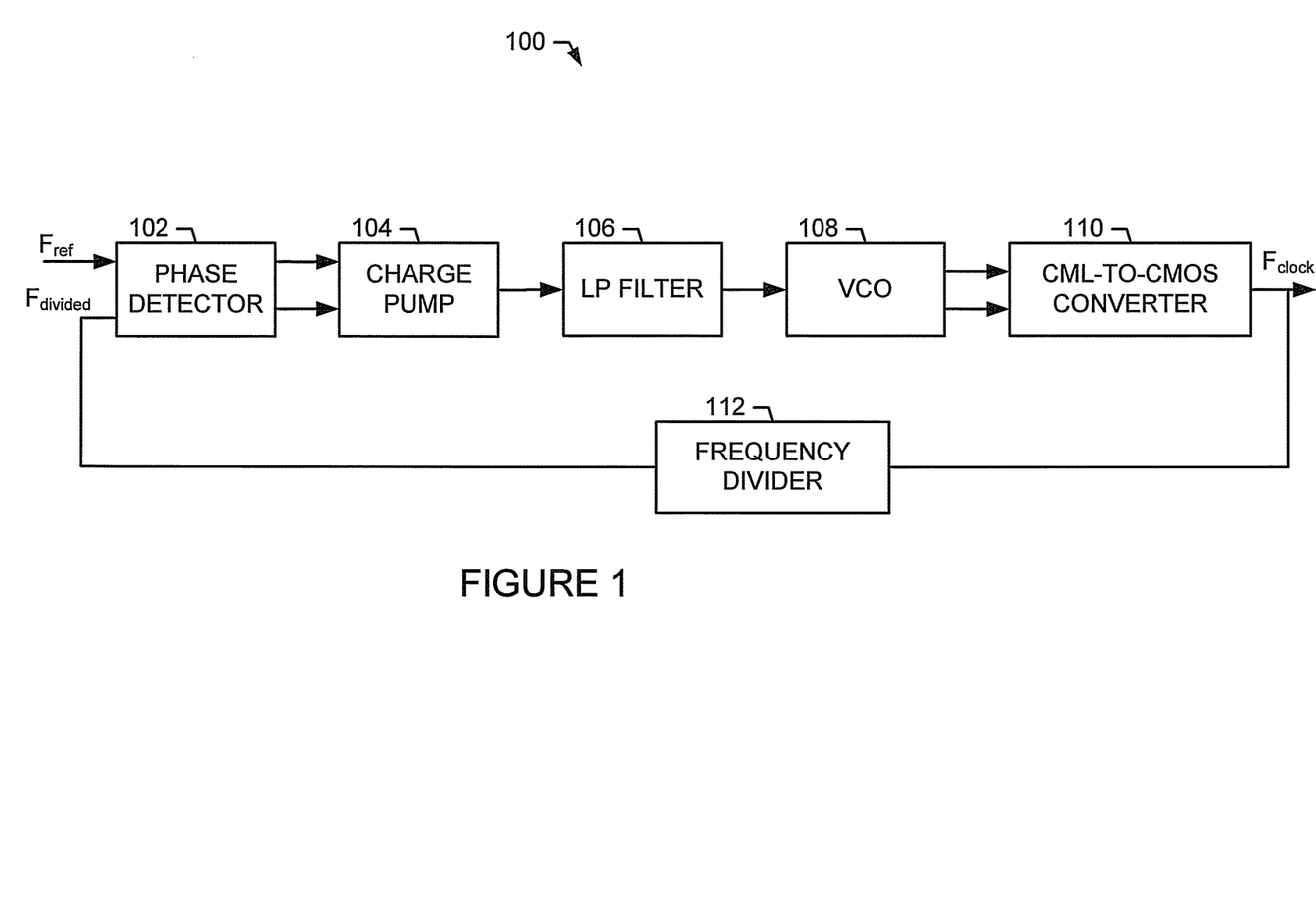
FIG. 1 depicts a typical PLL system with a CML-to-CMOS converter.

A phase-locked loop (PLL) is a control system that generates a signal having a fixed phase relationship to a reference signal. PLLs are widely used in radio, telecommunications, computers and other electronic applications. They may be used to generate stable frequencies, recover a signal from a noisy communication channel, or distribute clock timing pulses in digital logic designs such as microprocessors. FIG. 1 depicts a typical PLL 100 with a common-mode-logic-to-CMOS (CML-to-CMOS) converter. The PLL 100 compares a reference signal $F_{ref}$ with a divided version of the clock signal $F_{divided}$ and adjusts the output VCO 108 based on the results of the comparison so that the clock signal $F_{clock}$ maintains a fixed phase relationship with the reference signal $F_{ref}$.

At the output stage of a typical PLL circuit, a common-mode-logic-to-CMOS (CML-to-CMOS) converter 110 is required to convert the CML differential voltage levels to CMOS compatible voltage levels. CML voltage levels represent the two values of a data bit depending on which of the two levels is higher than the other. In contrast, a typical CMOS circuit operates according to a single ended signal with two pre-determined voltage levels defining the two values of transmitted data bits.

In high frequency PLLs used for clock applications in Application Specific Integrated Circuits (ASICs), it is difficult to maintain the duty cycle specification of the output clock of the PLL. Some applications require a tight specification for a duty cycle of 45-55%. As small geometries are used in the PLL circuit to achieve frequencies of up to 1 GHz, the mismatch between transistors and the mismatch in input signals causes increased spread in the duty cycle of the output clock. Therefore, it is desired to improve the circuit design of the CML-to-CMOS converter to achieve a duty cycle substantially equal to 50% in the output clock signal.

BRIEF SUMMARY OF THE INVENTION

Described herein is a common-mode-logic-to-CMOS (CML-to-CMOS) converter circuit for achieving a desired duty cycle on the output of a PLL. According to one embodiment, the CML-to-CMOS circuit includes a limiting differential amplifier for generating a single ended clock signal from a differential common mode clock signal, where the single ended clock signal has a duty cycle, a low-pass filter for generating a measurement of the duty cycle of the single ended clock signal, and a second differential amplifier for (i) comparing the measurement with a reference voltage and (ii) generating a differential bias current signal in response to the comparison, where the differential bias current signal is applied to the limiting differential amplifier for correcting the duty cycle of the single ended clock signal to a desired duty cycle.

According to a further embodiment, the limiting differential amplifier may include a first amplification stage having a first transistor and a second transistor, wherein the differential bias current signal is applied to a first load of the first transistor and a second load of the second transistor. The first transistor and the second transistor may be FET transistors. Furthermore, the differential bias current signal is applied to alter a first operating point of the first FET transistor and a second operating point of the second FET transistor.

The measurement of the duty cycle may have a single ended voltage level corresponding to the duty cycle of the single ended clock signal.

The reference voltage defines a desired duty cycle, where the desired duty cycle may be equal to 50%. Some embodiments allow for other values of a desired duty cycle, while other allow for selection or tuning to a desired duty cycle percentage. According to a further embodiment, the reference voltage may be generated by a voltage divider including a first resistor and a second resistor connected in series between a first voltage source and a second voltage source. According some embodiments, the reference voltage may be generated by a programmable resistor network. According to some other embodiments, the reference voltage may be generated by a digital-to-analog converter or may be provided by an external circuit.

According to a further embodiment, the CML-to-CMOS converter circuit may include at an output stage one or more buffers for inverting the single ended clock signal.

According to an alternative embodiment, a method is described for achieving a desired duty cycle on an output of a CML-to-CMOS converter. The method includes generating a single ended clock signal from a differential common mode clock signal using a limiting differential amplifier, wherein the single ended clock signal has a duty cycle, generating a differential bias current signal in response to the duty cycle of the single ended clock signal, and correcting the duty cycle of the single ended clock signal to a desired duty cycle by applying the differential bias current signal to the limiting differential amplifier.

According to a further embodiment, the limiting differential amplifier has a first amplification stage including a first transistor and a second transistor. In addition, the limiting differential amplifier has a first load provided by the first transistor and a second load provided by the second transistor. The first load has a first offset voltage component corresponding to a DC operating point of the first transistor and the second load has a second offset voltage component corresponding to a DC operating point of the second transistor. The method alters the DC operating points of the first transistor and the second transistor by applying the differential bias current signal to the first load and the second load. The differential bias current signal adjusts the first offset voltage component and the second offset voltage component by drawing additional currents from the first load and the second load of the limiting differential amplifier.

According to a further embodiment, the method may generate a measurement of the duty cycle of the single ended clock signal using a low-pass filter. The measurement has a single ended voltage level corresponding to the duty cycle of the single ended clock signal. In still a further embodiment, the method may compare the measurement of the duty cycle of the single ended clock signal with a reference voltage. The reference voltage defines a desired duty cycle, where the desired duty cycle may be equal to 50%.

These as well as other aspects, advantages, and alternatives will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION

Figure 2:
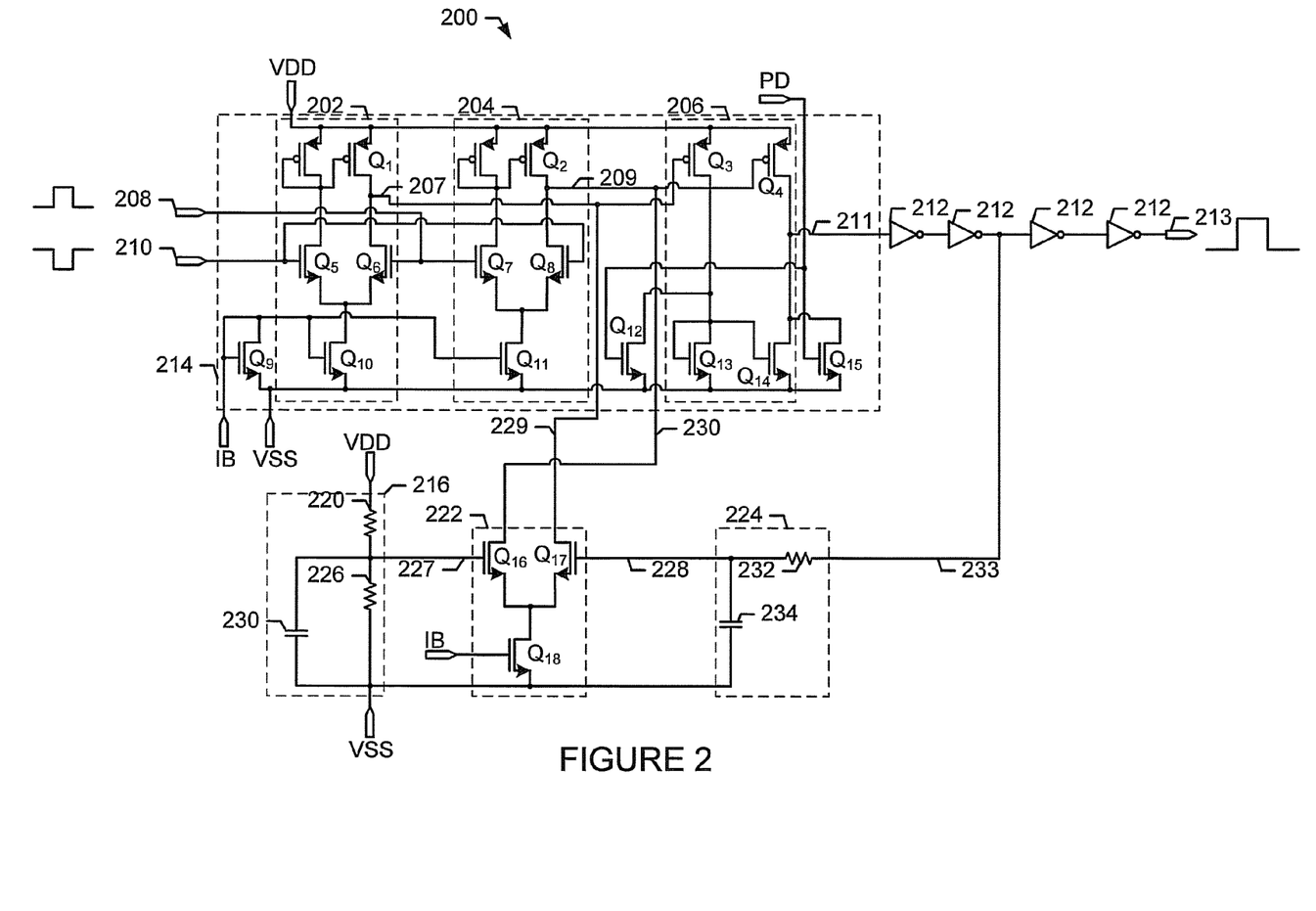
FIG. 2 depicts a CML-to-CMOS converter 200 according to one embodiment.

FIG. 2 depicts a common-mode-logic-to-CMOS (CML-to-CMOS) converter 200 according to one embodiment. The CML-to-CMOS converter 200 includes a limiting differential amplifier 214 connected between a first voltage source VDD and a second voltage source VSS, a low-pass filter 224, and a differential amplifier 222.

The CML-to-CMOS converter 200 receives a common-mode signal having components 208 and 210 and output a single ended clock signal 213. The components 208 and 210 of the common-mode signal may be sinusoidal wave forms, square wave forms, or other type of clock wave forms. The single ended clock signal 213 may be a square wave form having a duty cycle as well known in the art.

As further depicted in FIG. 2, the limiting differential amplifier 214 may include an input stage (i.e. a first amplification stage) including a differential amplifier 202 and a differential amplifier 204. The differential amplifier 202 has a P-MOSFET transistor $Q_1$ providing a first stage output 207 through the load (i.e. the drain) of the transistor $Q_1$. Similarly, the differential amplifier 204 has a P-MOSFET transistor $Q_2$ proving another first stage output 209 through the load (i.e. the drain) of the transistor $Q_2$. Notice that, the transistor $Q_1$ has a DC operating point defined by the DC voltage drop across the source and the drain and the corresponding current through the drain. Increasing or decreasing the current will alter the DC operating point of the transistor $Q_1$ and thereby alter the DC voltage drop. For example, increasing the current through the drain (i.e. the load) of $Q_1$ may move the DC operating point away from the origin. Accordingly, the DC voltage drop across $Q_1$ is increased and the DC voltage level of 207 is thereby decreased. As another example, decreasing the current through the drain of $Q_1$ may move the DC operating toward the origin and thereby increase the DC voltage level of 207. Similarly, the DC operating point of $Q_2$ may be altered by increasing or decreasing the current through its drain.

The limiting differential amplifier 214 may further include an output stage 206 having transistors $Q_3$, $Q_4$, $Q_{13}$, and $Q_{14}$, where $Q_3$ and $Q_4$ may be P-MOSFET transistors and $Q_{13}$ and $Q_{14}$ may be N-MOSFET transistors. The first stage outputs 207 and 209 (i.e. the loads of the first stage) are connected to the gates of the transistors $Q_3$ and $Q_4$, respectively, as the inputs to the output stage 206. The single ended clock output 211 of the limiting differential amplifier 214 is taken from the drain of the N-MOSFET transistor $Q_4$. A further analysis of the circuit shows that the N-MOSFET transistors $Q_3$ and $Q_4$ form a push-pull differential pair as well known in the art, providing the output clock signal 211. As depicted in FIG. 2, the P-MOSFET transistor pair $Q_{13}$ and $Q_{14}$ provides a current mirror that mirrors the current through the drain of $Q_3$ to the drain of $Q_{14}$. Therefore, the transistors $Q_3$ and $Q_4$ operate as a push-pull differential pair, where they turn on and off alternatively, generating high and low voltage levels of the output clock signal 211. For example, when 207 goes high and 209 goes low, $Q_3$ and $Q_3$ turns off and $Q_4$ turns on. Accordingly, output 211 is connected to the first voltage source VDD (e.g. a high voltage level) through $Q_4$ and, therefore, goes high. As another example, when 207 goes low and 209 goes high, $Q_3$ turns on and $Q_4$ turns off. Accordingly, output 211 is connected to the second voltage source CSS (e.g. a low voltage level) through $Q_{14}$ and, therefore, goes low.

The limiting differential amplifier 214 may also include N-MOSFET transistors $Q_9$, $Q_{10}$, and $Q_{11}$ for generating bias currents for the input stages 202 and 204. Specifically, the diode-connected transistor $Q_9$ provides control, according to the signal IB, to the transistors $Q_{10}$ and $Q_{11}$ that provide bias currents to the differential amplifiers 202 and 204.

Additionally, the limiting differential amplifier 214 may receive a power down (PD) signal through N-MOSFET transistors $Q_{12}$ and $Q_{15}$. The transistors $Q_{12}$ and $Q_{15}$ provide additional benefits, as well known in the art, during the design and manufacturing of the CML-to-CMOS converter 200.

As further depicted in FIG. 2, the CML-to-CMOS converter 200 may include one or more signal buffers 212 connected to the output of the limiting differential amplifier 214. The one or more signal buffers 212 provide signal inversions to ensure that output signal 213 and signal 233 have desired polarities.

The CML-to-CMOS converter 200 also includes a low pass filter 224 for generating a measurement 228 of the duty cycle of the single ended clock signal 211. Specifically, the low pass filter 224 may be a simple analog filter including a resistor 232 and a capacitor 234. The resistor and the capacitor are chosen to convert the single ended clock signal 233 into a single ended voltage 228 representing the duty cycle of the output clock. The measurement voltage 228 has a single ended voltage level that increases or decreases as the duty cycle of the clock signal 233 varies. That is, the low pass filter provides an average of the voltage level, which is directly determined and correlated to the duty cycle.

The CML-to-CMOS converter 200 may also include a reference voltage generator 216 connected between the first voltage source VDD and the second voltage source VSS. The reference voltage generator 216 generates a reference voltage level 227 that represents a desired duty cycle. In most PLL circuits, the desired duty cycle is 50%. As an example depicted in FIG. 2, the reference voltage generator 216 may include a voltage divider having a first capacitor 220 and a second capacitor 226 connected in series between the first voltage source VDD and the second voltage source VSS. A capacitor 230 is connected in parallel with 226 to reduce the voltage fluctuation of the reference 227. Alternatively, the reference voltage generator 216 may include a programmable resistor network or a digital-to-analog converter as well known in the art. Other embodiments of the voltage generator 224 may also be applied for providing the reference voltage 227. For example, the reference voltage 227 may be provided by an external circuit having a tunable voltage source. The reference voltage 227 may be generated off chip and provided as an input to the CML-to-CMOS converter 200.

The CML-to-CMOS converter 200 includes another differential amplifier 222 for comparing the duty cycle measurement 228 and the reference 227 and generating a differential bias current signal having components 229 and 230 based on the comparison. The amplifier 222 includes an N-MOSFET transistor $Q_{18}$ receiving control signal IB for providing bias current to the differential N-MOSFET pair $Q_{16}$ and $Q_{17}$. The differential amplifier 222 generates the differential bias current signal 229 and 230 by comparing the measurement 228 with the reference 227. The differential bias current signal components 229 and 230 are then taken from the loads (i.e. the drains) of $Q_{17}$ and $Q_{16}$ and connected, respectively, to the output 207 of the first stage amplifier 202 and the output 209 of the first stage amplifier 204. Further notice that the components 229 and 230 of the differential bias current signal fall and rise in opposite direction. That is, as the current level of 229 increases, the current level of 230 decreases by approximately the same amount. Similarly, as the current level 229 decreases, the current level of 230 increases again by approximately the same amount.

Figure 4:
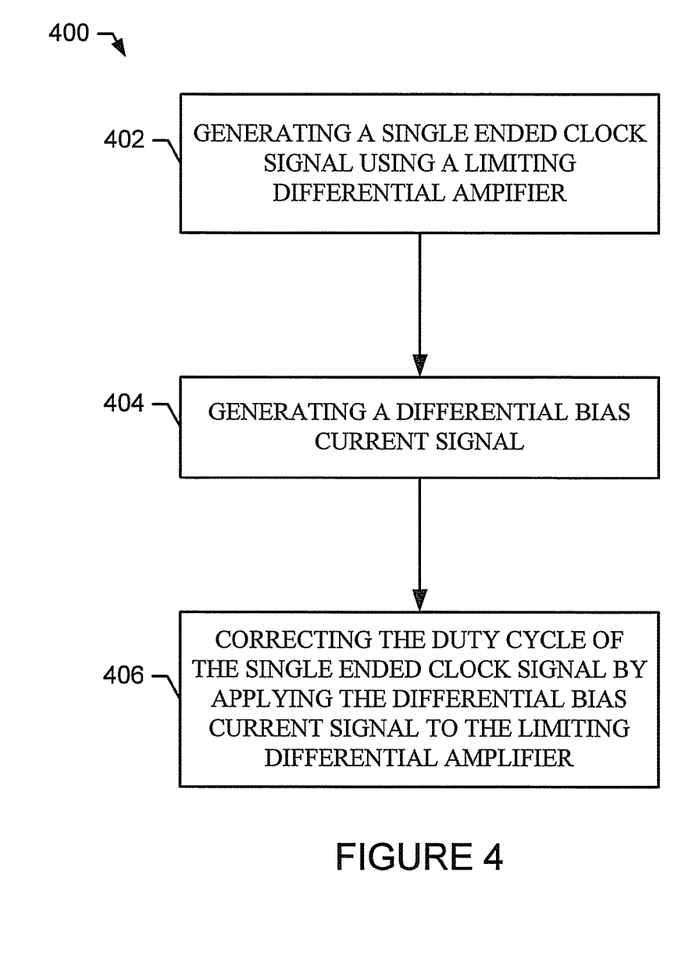
FIG. 4 depicts a method 400 for achieving a desired duty cycle at the output of an CML-to-CMOS converter according to still another embodiment.

The operation of the CML-to-CMOS converter 200 is described below. As depicted in FIG. 4, a method 400 for achieving a desired duty cycle on the output of the CML-to-CMOS converter is depicted. In block 402, the method includes generating a single ended clock signal using a limiting differential amplifier. Specifically, the limiting differential amplifier 200 receives a common mode differential signal having components 208 and 210 and generates a single ended clock signal 211 (block 402). The clock signal 211 is inverted one or more times by the signal buffers 212 to produce a clock signal 233 with a desired polarity. In addition, the clock signal 211 has a duty cycle that tends to deviate from the desired duty cycle (i.e. 50%) due to mismatches of the transistor pairs and the common mode input signal.

In block 404, the method includes generating a differential bias current signal in response to the duty cycle of the single ended clock signal 211. Specifically, the low pass filter 224 processes the clock signal 233 and generates the measurement 228 of the duty cycle, where the voltage level of 228 represents the duty cycle of the clock signal 233. The differential amplifier 222 receives the measurement 228 and the reference voltage 227 generated by the reference generator as described above and generates a differential bias current signal having components 229 and 230.

In block 406, the method includes correcting the duty cycle of the single ended clock signal to a desired duty cycle by applying the differential bias current signal to the limiting differential amplifier. Specifically, when the clock signal 233 has a duty cycle lower than the desired duty cycle (i.e. 50%), the measurement voltage 228 decreases and becomes lower than the reference voltage 227. Accordingly, due to the imbalanced inputs to the differential amplifier 222, the differential current component 230 starts to draw more current from the drain of the transistor $Q_2$, and thereby alters the DC operating point of the transistor $Q_2$ and increases the DC voltage drop across $Q_2$. Such an increase of the DC voltage drop decreases the DC voltage level of 209 and thereby causes the transistor $Q_4$ to turn on earlier. On the other hand, the imbalanced inputs to the differential amplifier 222 causes the differential current component 229 to decrease the current drawn from the drain of the transistor $Q_1$ and thereby alters the DC operating point of $Q_1$ to decrease the DC voltage drop across $Q_1$. Such a decrease of the voltage drop across $Q_1$ increases the voltage level of 207 and thereby causes the transistor $Q_3$ to turn on later. Since transistors $Q_3$ and $Q_4$ form a push-pull differential pair as described above, such an alteration the DC voltages of 207 and 209 increases the time duration in which the clock signal 211 remains high and decreases the time duration in which the clock signal 211 remains low. Consequently, the duty cycle of the clock signal 211 is increased toward the desired duty cycle.

On the other hand, when the clock signal 233 has a duty cycle higher than the desired duty cycle (i.e. 50%), the measurement 228 has a voltage level greater than that of the reference 227. The imbalanced inputs to the differential amplifier 222 cause the differential bias current component 229 to increase and the differential bias current component 230 to decrease. As the operating points of $Q_1$ and $Q_2$ are altered by the differential bias current signal, the DC voltage level of 207 is increased and the DC voltage level of 209 is decreased. Accordingly, the transistor $Q_3$ turns on earlier and turns off later in time while the transistor $Q_4$ turns on later and turns off earlier in time. Such an alteration of the DC operating points of $Q_1$ and $Q_2$ causes the clock signal 211 to rise later and fall earlier in time, thereby decreasing the duty cycle toward the desired duty cycle.

Figure 3:
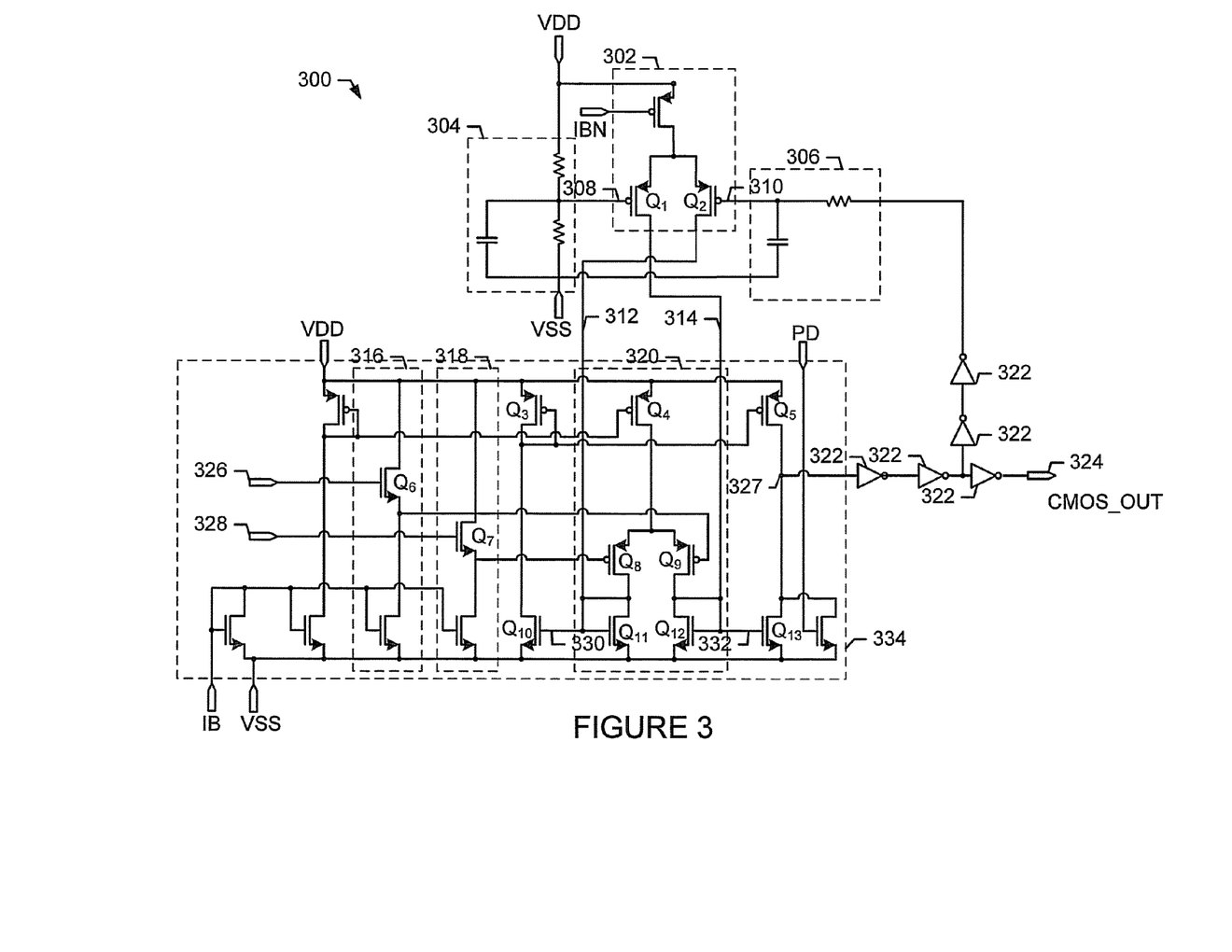
FIG. 3 depicts a CML-to-CMOS converter 300 according another embodiment.

With respect to FIG. 3, another embodiment of the CML-to-CMOS converter is depicted. Similar to the CML-to-CMOS converter 200, the CML-to-CMOS converter 300 receives a differential common mode clock signal having components 326 and 328 and outputs a single ended clock signal 324. The CML-to-CMOS converter further includes a limiting differential amplifier 334 for generating a single ended clock signal 327 from the common mode clock signal 326 and 328, a low pass filter 306 for generating a measurement 310 of the duty cycle of the single clock signal 327, and another differential amplifier 302 for comparing the measurement 310 with a reference voltage 208 and generating a differential bias current signal having components 312 and 314. Again, the clock signal 327 has a duty cycle that tends to deviate from the desired duty cycle due to the mismatches of the transistor pairs and the input signals.

As further depicted in FIG. 3, the limiting differential amplifier 334 is a three-stage amplifier having first amplification stages 316 and 318, a second amplification stage 320, and an output stage including P-MOSFET transistors $Q_3$ and $Q_5$ and N-MOSFET transistors $Q_{10}$ and $Q_{13}$. The transistors $Q_{10}$ and $Q_{13}$ form a push-pull differential pair through the current mirror provided by $Q_3$ and $Q_5$, where the drain current of $Q_5$ is mirrored from the drain current of $Q_{10}$.

The differential amplifier 302 may include two P-MOSFET transistors $Q_1$ and $Q_2$ as depicted in FIG. 3. Instead of drawing additional current from the limiting differential amplifier 334, the differential bias current signal components 312 and 314 inject additional currents to the drains of the N-MOS transistors $Q_{11}$ and $Q_{12}$, respectively, and thereby altering the DC operating points of the transistors $Q_{11}$ and $Q_{12}$ for correcting the duty cycle of the single ended clock signal 327 to the desired duty cycle (i.e. 50%).

Specifically, for example, when the duty cycle of the clock signal 327 becomes lower than 50%, the corresponding measurement 310 drops below the reference voltage 308. Due to the imbalanced inputs, the differential amplifier 302 generates a differential bias current signal, injecting a larger current to the drain of $Q_{11}$ and a smaller current to the drain of $Q_{12}$. As the DC operating point of $Q_{11}$ is altered by the current component 312, the DC voltage drop across $Q_{11}$ is increased, thereby increasing the DC voltage level of 330 and causing the transistor $Q_{10}$ to turn on earlier and turn off later in time. On the other hand, the current component 314 alters the DC operating point of $Q_{12}$ by reducing the current through the drain. Accordingly, the DC voltage level of 332 is reduced, thereby causing the transistor $Q_{13}$ to turn off earlier and turn on later in time. As a result, the time duration in which the clock signal 327 remains high increases while the time duration in which the clock signal 327 remains low decreases. Consequently, the differential bias current components 312 and 314 increase the duty cycle of the clock signal 327 toward the desired duty cycle (i.e. 50%).

As another example, when the duty cycle of the clock signal 327 becomes higher than 50%, the measurement 310 of the duty cycle becomes higher than the reference voltage 308. The imbalance inputs 308 and 310 cause the differential amplifier 302 to generate a larger differential bias current component in 314 and a smaller component in 312. As the differential bias current signal 312 and 314 inject additional currents into the drains of $Q_{11}$ and $Q_{12}$, the operating points of these two transistors are altered. Specifically, the signal component 312 decreases the DC voltage drop across $Q_{11}$, thereby reducing the DC voltage level of 330 and causing the transistor $Q_{10}$ to turn on later and turn off earlier in time. On the other hand, the signal component 314 increases the DC voltage drop across $Q_{12}$, thereby increasing the DC voltage level of 332 and causing the transistor $Q_{13}$ to turn on earlier and turn off later in time. Consequently, the differential bias current signal 312 and 314 decreases the duty cycle of the clock signal 327 toward the desired duty cycle (i.e. 50%).

According to a further embodiment, the transistor pairs of the differential amplifiers 222 and 302 depicted in FIGS. 2 and 3 have large sizes to substantially limit the mismatch of these transistor pairs.

Those skilled in the art will recognize and appreciate that the CML-to-CMOS converter 200 may have a greater operating speed than the CML-to-CMOS converter 300, while the CML-to-CMOS converter 300 may provide a more precise duty cycle correction. It may be further appreciated that the CML-to-CMOS converters 200 and 300 may be tuned to process signals in pre-determined frequency ranges. They may be utilized individually by the PLL system depicted in FIG. 1, or may be combined with other obvious variations to process signals in a broader frequency range.

Exemplary embodiments of the invention have been described above. Those skilled in the art will appreciate that changes may be made to these embodiments described without departing from the true spirit and scope of the invention as defined by the claims.

I claim:
1. A method for achieving a desired duty cycle on an output of a PLL comprising:
    generating a single ended clock signal from a differential common mode clock signal using a limiting differential amplifier, wherein the single ended clock signal has a duty cycle;
    receiving, via a low pass filter, the single ended clock signal;
    generating, via the low pass filter, a single ended measurement of the duty cycle of the single ended clock signal;
    receiving, via at least one gate terminal of a second differential amplifier different than the limiting differential amplifier, the single ended measurement of the duty cycle of the single ended clock signal;
    generating, using the second differential amplifier, a differential bias current signal in response to the single ended measurement of the duty cycle of the single ended clock signal; and
    correcting the duty cycle of the single ended clock signal to a desired duty cycle by via applying the differential bias current signal from the second differential amplifier to the limiting differential amplifier.
2. The method of claim 1, wherein the limiting differential amplifier has a first amplification stage having a first transistor and a second transistor, the method further comprising applying the differential bias current signal to the first transistor and the second transistor for correcting the duty cycle of the single ended clock signal.

3. The method of claim 2, wherein the first amplification stage has a first load provided by the first transistor and a second load provided by the second transistor, and wherein each of the first transistor and the second transistor has a DC operating point, the method further comprising applying the differential bias current signal to the first load and the second load for altering the DC operating point of each of the first transistor and the second transistor.

4. The method of claim 3, wherein the first load has a first offset voltage component corresponding to the DC operating point of the first transistor and the second load has a second offset voltage component corresponding to the DC operating point of the second transistor, the method further comprising altering the DC operating point of each of the first transistor and the second transistor by using the differential bias current signal to adjust the first offset voltage component and the second offset voltage component.

5. The method of claim 2, wherein the first transistor and the second transistor are FET transistors.

6. The method of claim 1, wherein the single ended measurement of the duty cycle of the single ended clock signal includes a single ended voltage level corresponding to the duty cycle of the single ended clock signal.

7. The method of claim 6, further comprising comparing, by the second differential amplifier, the single ended measurement of the duty cycle of the single ended clock signal with a reference voltage, wherein the reference voltage defines a desired duty cycle.

8. The method of claim 7, wherein the differential bias current signal is generated by a differential amplifier in response to the comparison.

9. The method of claim 1 further comprising inverting the single ended clock signal using at least one buffer.

10. The method of claim 1 wherein the desired duty cycle is equal to 50%.

11. The method of claim 7 further comprising generating the reference voltage using a voltage divider, wherein the voltage divider comprising a first resistor and a second resistor connected in series between a first voltage source and a second voltage source.

12. The method of claim 7 further comprising generating the reference voltage using a programmable resistor network.

13. The method of claim 7 further comprising generating the reference voltage using a digital-to-analog converter.

14. The method of claim 7, wherein the reference voltage is provided by an external circuit.

15. A Common Mode Logic to Complementary Metal Oxide Semiconductor (CML-to-CMOS) converter circuit for achieving a desired duty cycle on the output of a PLL, the circuit comprising:
    a limiting differential amplifier configured to generate a single ended clock signal from a differential common mode clock signal, wherein the single ended clock signal has a duty cycle;
    a low-pass filter configured to receive the single ended clock signal and generate a single ended measurement of the duty cycle of the single ended clock signal; and
    a second differential amplifier configured to receive the single ended measurement of the duty cycle of the single ended clock signal via at least one gate terminal of the second differential amplifier, and generate a differential bias current signal in response to the single ended measurement of the single ended clock signal,
    wherein the second differential amplifier is further configured to apply the differential bias current signal to the limiting differential amplifier to correct the duty cycle of the single ended clock signal to a desired duty cycle.

16. The circuit of claim 15, wherein the limiting differential amplifier has a first amplification stage having a first transistor and a second transistor, and wherein the differential bias current signal is applied to a first load of the first transistor and a second load of the second transistor to correct the duty cycle of the single ended clock signal to a desired duty cycle.

17. The circuit of claim 16, wherein the first transistor and the second transistor are FET transistors.

18. The circuit of claim 15, wherein the limiting differential amplifier has a first amplification stage having a first FET transistor and a second FET transistor, and wherein the differential bias current signal is applied to alter a first operating point of the first FET transistor and a second operating point of the second FET transistor.

19. The circuit of claim 15, wherein the single ended measurement of the duty cycle of the single ended clock signal includes a single ended voltage level corresponding to the duty cycle of the single ended clock signal.

20. The circuit of claim 15, wherein the second differential amplifier is further configured to compare the single ended measurement of the duty cycle of the single ended clock signal to a reference voltage.

\* \* \* \* \*

UNITED STATES PATENT AND TRADEMARK OFFICE
CERTIFICATE OF CORRECTION

| | | |
|---|---|---|
| PATENT NO. | : 7,965,118 B2 | |
| APPLICATION NO. | : 12/171805 | |
| DATED | : June 21, 2011 | |
| INVENTOR(S) | : James D. Seefeldt | |

It is certified that error appears in the above-identified patent and that said Letters Patent is hereby corrected as shown below:

Column 7, line 59 (Claim 1), "duty cycle by via applying" should be -- duty cycle via applying --

Signed and Sealed this
Twenty-sixth Day of June, 2012

David J. Kappos
*Director of the United States Patent and Trademark Office*